United States Patent
Jebory et al.

(10) Patent No.: US 9,245,826 B2
(45) Date of Patent: Jan. 26, 2016

(54) ANCHOR VIAS FOR IMPROVED BACKSIDE METAL ADHESION TO SEMICONDUCTOR SUBSTRATE

(71) Applicant: Newport Fab, LLC, Newport Beach, CA (US)

(72) Inventors: Hadi Jebory, Irvine, CA (US); David J. Howard, Irvine, CA (US); Scott B. Stetson, Huntington Beach, CA (US)

(73) Assignee: Newport Fab, LLC, Newport Beach, CA (US)

( * ) Notice: Subject to any disclaimer, the term of this patent is extended or adjusted under 35 U.S.C. 154(b) by 0 days.

(21) Appl. No.: 14/165,377

(22) Filed: Jan. 27, 2014

(65) Prior Publication Data

US 2014/0252651 A1  Sep. 11, 2014

Related U.S. Application Data

(60) Provisional application No. 61/776,063, filed on Mar. 11, 2013.

(51) Int. Cl.
*H01L 23/48* (2006.01)
*H01L 23/00* (2006.01)

(52) U.S. Cl.
CPC ............. *H01L 23/481* (2013.01); *H01L 23/562* (2013.01); *H01L 2924/0002* (2013.01)

(58) Field of Classification Search
USPC .......... 257/774, 621, E21.597; 438/629, 630, 438/637–640, 668, 672, 675
See application file for complete search history.

(56) References Cited

U.S. PATENT DOCUMENTS 8,431,481 B2 * 4/2013 Dunne et al. .................. 438/629
8,710,629 B2 * 4/2014 Bai et al. ....................... 257/618

* cited by examiner

*Primary Examiner* — Jasmine Clark
(74) *Attorney, Agent, or Firm* — Farjami & Farjami LLP

(57) ABSTRACT

Disclosed is a structure having anchor vias for improved backside metal adhesion and an associated method for the structure's fabrication. The structure includes at least one anchor via disposed in at least one corner of a semiconductor substrate. A metal filler may be formed within the at least one anchor via, the metal filler having a protruding portion extending from a backside of the semiconductor substrate. The structure may further include a backside metal layer on a bottom surface of the semiconductor substrate, the backside metal layer being bonded to the protruding portion of the metal filler in the at least one anchor via. The at least one anchor via may include a cluster of anchor vias, a plurality of anchor vias disposed in a straight line and/or in a staggered configuration along a periphery of the semiconductor substrate.

20 Claims, 5 Drawing Sheets

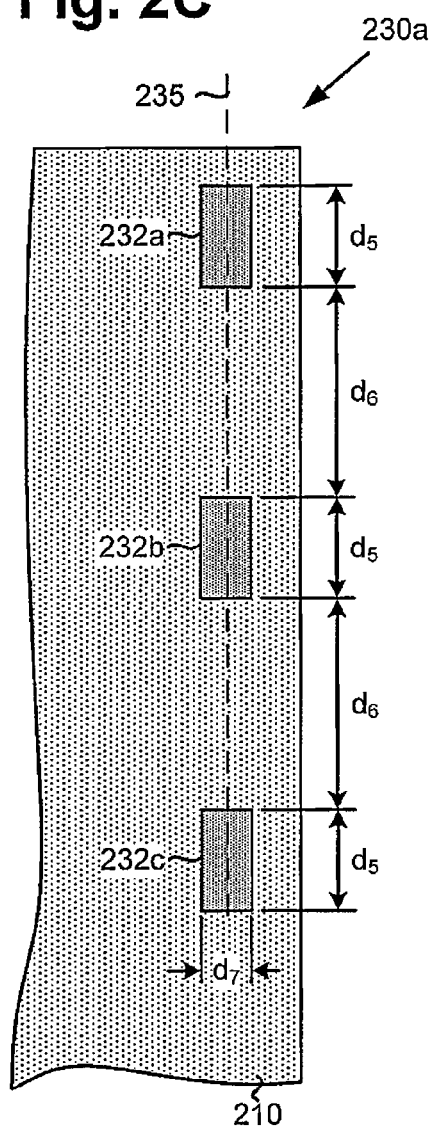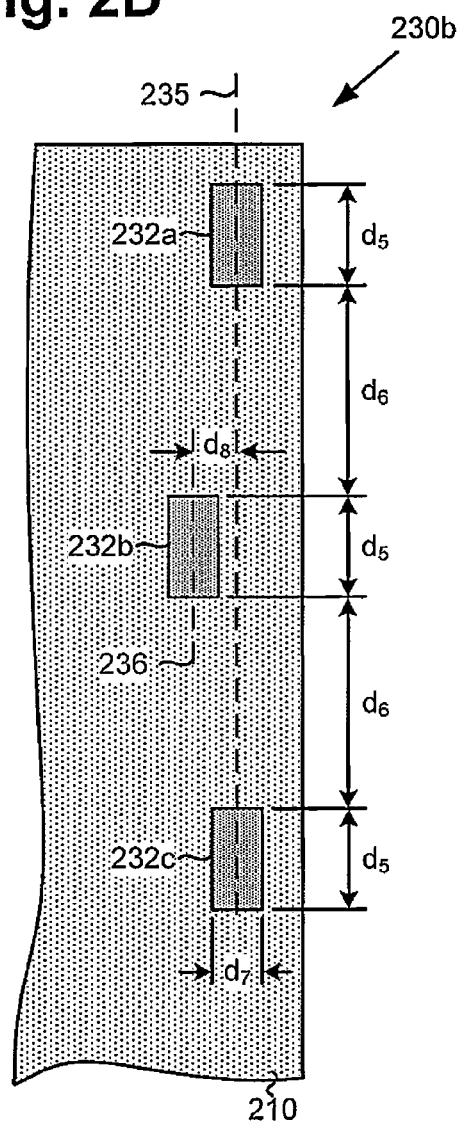

ANCHOR VIAS FOR IMPROVED BACKSIDE METAL ADHESION TO SEMICONDUCTOR SUBSTRATE

The present application claims the benefit of and priority to a provisional patent application entitled "Anchor Vias for Improved Backside Metal Adhesion to Semiconductor Substrate", Ser. No. 61/776,063, filed on Mar. 11, 2013. The disclosure in this provisional application is hereby incorporated fully by reference into the present application.

BACKGROUND

Semiconductor substrate density has continuously increased, and continues to increase. Further miniaturization and increased density in semiconductor substrates has typically relied on a backside metal layer attached to the substrate to provide a common ground for the increasing number of active components on the semiconductor substrate. However, to ensure high fabrication yields the backside metal layer must remain securely attached to the substrate throughout the entire fabrication process and then for years during operation.

One conventional method of adhering a backside metal layer to a substrate relies on forming a backside metal stack having several layers, the first of which must form an adhesive bond with the substrate. For example, an interface layer may be deposited on a bottom side of the substrate followed by a thicker current carrying layer, and finally an outer packaging contact layer. However, fabrication procedures such as semiconductor die singulation and pick-and-place processes subject the semiconductor substrate to very high stresses, especially near the edges and/or corners of the die. Because adhesion of the backside metal stack to the substrate is almost entirely dependent on the adhesive qualities between the substrate and the interface layer, unacceptably low yields are often achieved during fabrication due to the backside metal layer peeling from the semiconductor substrate.

SUMMARY

The present disclosure is directed to anchor vias for improved backside metal adhesion to a semiconductor substrate, substantially as shown in and/or described in connection with at least one of the figures, and as set forth more completely in the claims.

BRIEF DESCRIPTION OF THE DRAWINGS

FIG. 2C presents an exemplary diagram disclosing a magnified view of anchor vias disposed in a straight-line configuration for improved backside metal adhesion, in accordance with an implementation of the present application.

FIG. 2D presents an exemplary diagram disclosing a magnified view of anchor vias disposed in a staggered configuration for improved backside metal adhesion, in accordance with an implementation of the present application.

DETAILED DESCRIPTION

Figure 1A:
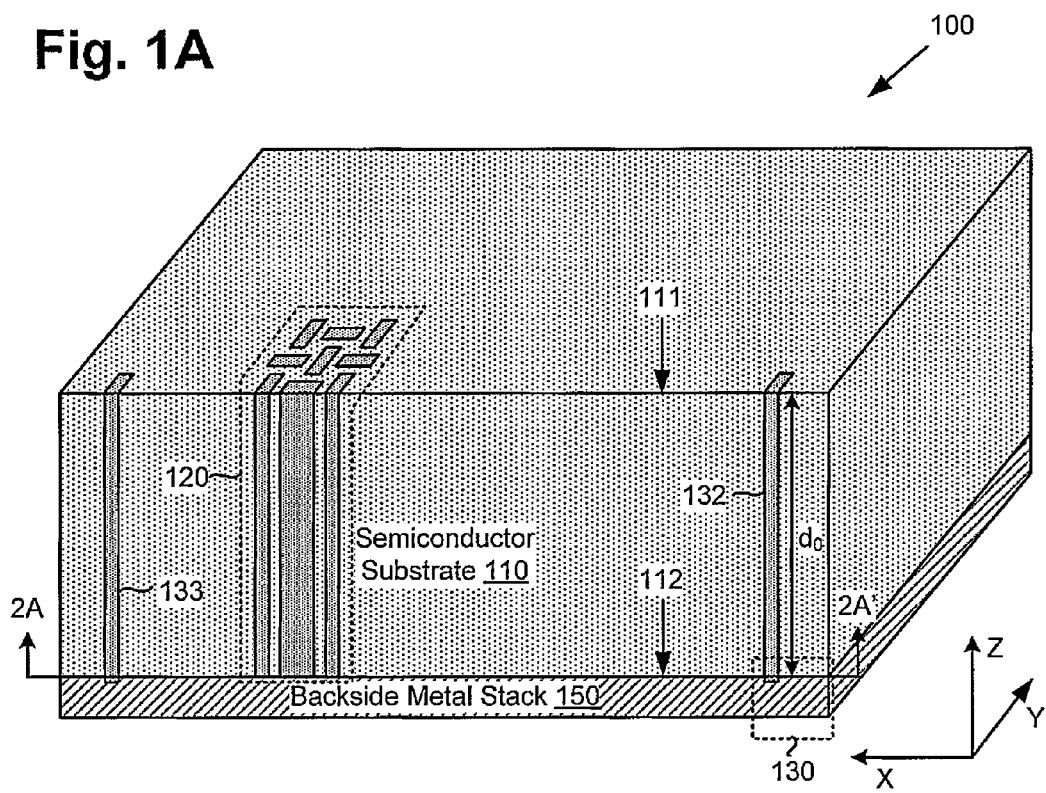
FIG. 1A presents an exemplary diagram disclosing a cross-section of a semiconductor structure having anchor vias for improved backside metal adhesion, in accordance with an implementation of the present application.

The following description contains specific information pertaining to implementations in the present disclosure. One skilled in the art will recognize that the present disclosure may be implemented in a manner different from that specifically discussed herein. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

The present inventive concepts utilize one or more anchor vias fabricated along the periphery of a semiconductor substrate and bonded to the backside metal layer to improve backside metal adhesion to the semiconductor substrate. Advantages of the present inventive concepts include a substantial reduction in peeling backside metal layers, increased RF performance, increased fabrication yields, and more robust semiconductor substrates and devices, as will be explained in more detail below.

FIG. 1A presents an exemplary diagram disclosing a cross-section of a semiconductor structure having anchor vias for improved backside metal adhesion, in accordance with an implementation of the present application. FIG. 1A discloses semiconductor structure 100, including semiconductor substrate 110 having top surface 111, or front side, and bottom surface 112, or backside, after a backside grind or polish and deposition of a backside metal stack 150. As is customary in semiconductor fabrication, front side processes may be performed on semiconductor substrate 110 before backside processes. However, for the purpose of illustration, any material layers formed during a front side process are not shown in FIG. 1A. FIG. 1A shows group 120 of through silicon vias (TSVs) as well as anchor via 132 and anchor via 133. Each may be formed in semiconductor substrate 110 and may be filled with a metal filler, such as tungsten or titanium for example. As shown in FIG. 1A, group 120 of TSVs is formed in a core region of semiconductor substrate 110, while each of anchor vias 132 and 133 are formed in a peripheral region of semiconductor substrate 110. Metal filler within group 120 of TSVs provide low resistance, low inductance ground connections to one or more active devices fabricated in and/or on semiconductor substrate 110 and may be electrically connected to an overlying metal layer, such as a metal 1 layer for example, for grounding active devices such as the emitters of bipolar transistors.

Figure 1B:
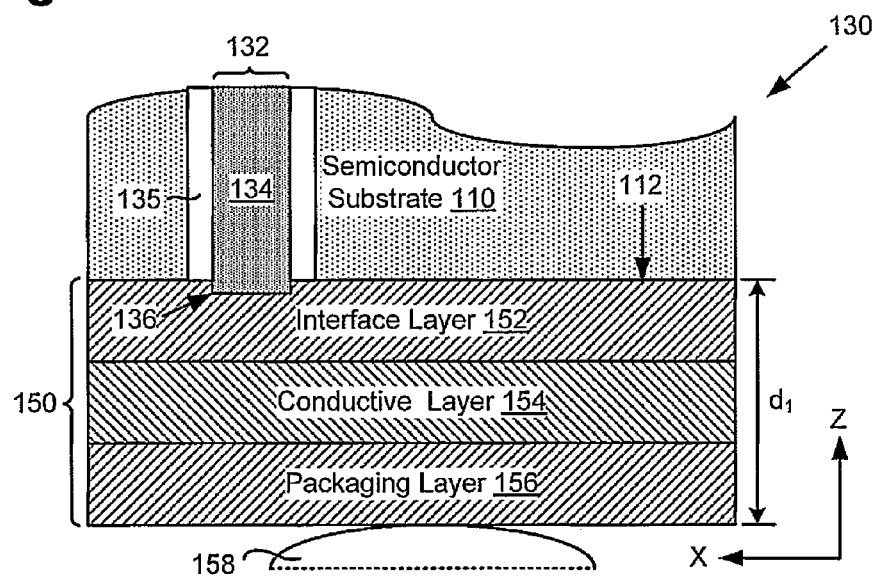
FIG. 1B presents an exemplary diagram disclosing a magnified cross-section of a portion of an anchor via for improved backside metal adhesion, in accordance with an implementation of the present application.

By contrast, a metal filler within anchor vias 132 and 133 does not provide ground connection to any active devices and instead provides physical anchor points between semiconductor substrate 110 and the underlying backside metal stack 150, which may be formed on bottom side 112 of semiconductor substrate 110 as shown in more detail in FIG. 1B. Each of anchor vias 132 and 133 may be formed to a depth $d_0$ of 100 μm into semiconductor substrate 110. However, anchor vias 132 and 133 are not so limited and $d_0$ may be greater or less than this value, according to the particular application. In addition, the metal filler within anchor vias 132 and 133 may either not contact a front side metal layer, or if contacting a front side metal layer such as metal 1 layer, the contacted portion of metal 1 layer may be patterned such that the metal filler within anchor vias 132 and 133 essentially has a floating voltage potential during operation. Where the metal filler within anchor vias is connected to an overlying metal layer, the anchor vias may provide increased holding strength due to the additional physical connection to the overlying metal layer.

FIG. 1B presents an exemplary diagram disclosing a magnified cross-section of a portion of an anchor via for improved backside metal adhesion, in accordance with an implementation of the present application. For example, FIG. 1B shows magnified view 130 including anchor via 132 and backside metal stack 150 formed on bottom side 112 of semiconductor substrate 110. Insulating layer 135 may optionally be formed within anchor via 132 before metal filler 134 is deposited in applications where substantial isolation between semiconductor substrate 110 and metal filler 134 is desired. Insulating layer 135 may be a dielectric layer such as silicon dioxide, for example. As shown in FIG. 1B, metal filler 134 may protrude from bottom side 112 to form protruding portion 136 such that when interface layer 152 is deposited on bottom side 112 of semiconductor substrate 110 the additional contact between metal filler 134 and interface layer 152 form a very strong physical, metal-on-metal bond. Metal filler 134 may be tungsten, titanium, or any other suitable metal filler. Interface layer 152 may be formed from metals such as titanium or chrome-vanadium. Conduction layer 154 may then be formed on interface layer 152 using metals such as nickel or copper. Packaging layer 156 may then be formed on conduction layer 154 using metals such as gold or silver to provide a very low resistance contact surface. Packaging layer 156 may subsequently be connected to, one or more contacts, such as contact 158 for example, which may be a solder bump on a semiconductor package or on a printed circuit board (PCB), or a metal epoxy or a solid metal contact. Though the thickness of each of interface layer 152, conduction layer 154, and packaging layer 156 may vary, backside metal stack 150 may have a total thickness $d_1$ of between 0.5 μm and 3.0 μm. However, backside metal stack 150 is not so limited and may have a thickness outside this range, according to the requirements of a particular application. Moreover, the present application contemplates implementations including one or more of interface layer 152, conductive layer 154, and/or packaging layer 156.

Thus, any of these layers in isolation or in combination may be interchangeable with the term backside metal stack or backside metal layer. Moreover, the metals disclosed above for each of interface layer 152, conductive layer 154, and packaging layer 156 are exemplary only and may include any appropriate metals according to the particular application.

Figure 2A:
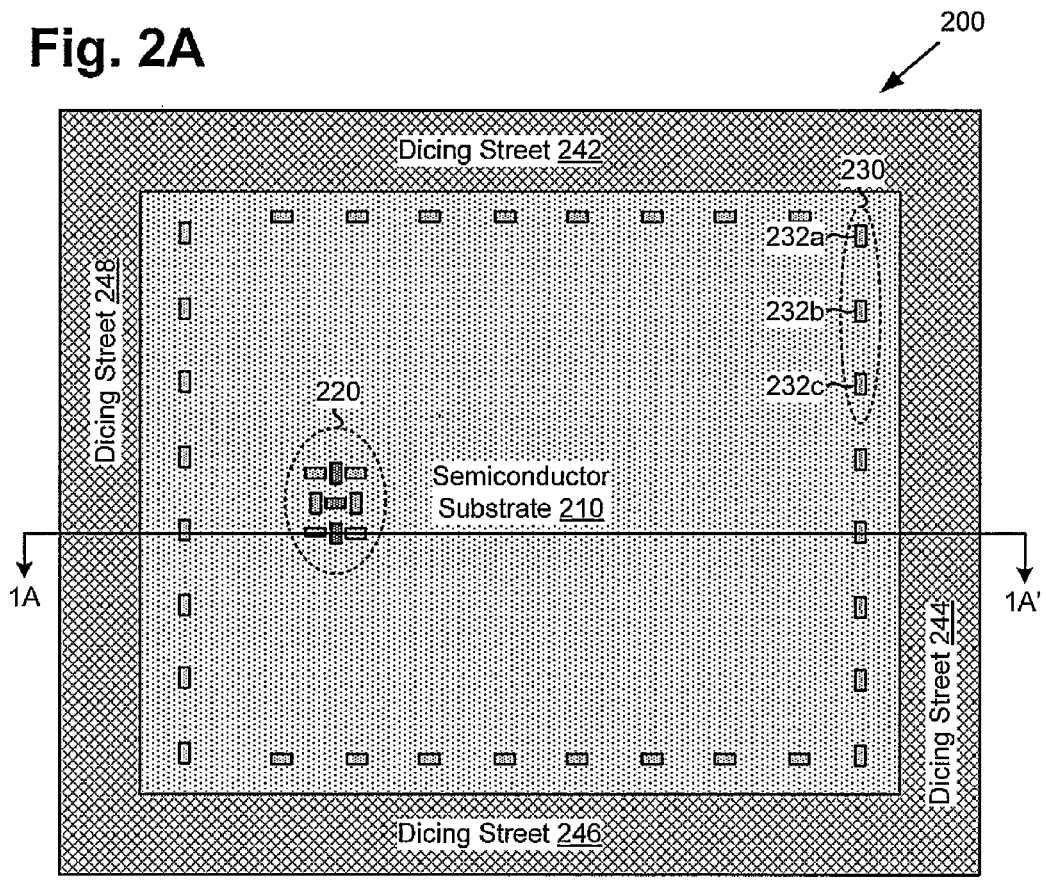
FIG. 2A presents an exemplary diagram disclosing a backside view of a semiconductor structure having anchor vias for improved backside metal adhesion, in accordance with an implementation of the present application.

FIG. 2A presents an exemplary diagram disclosing a backside view of a semiconductor structure having anchor vias for improved backside metal adhesion, in accordance with an implementation of the present application. For example, view 200 may correspond to a view of the structure shown in FIG. 1A taken at plane 2A-2A' and in the direction of the arrows. Likewise, FIG. 1A may correspond to a view of the structure shown in FIG. 2A taken at plane 1A-1A' and in the direction of the arrows. For simplicity of illustration, FIG. 2A provides a backside view of semiconductor substrate 210 after a backside grind or polish and before application of a backside metal stack. Semiconductor substrate 210 may include group 220 of TSVs and several anchor vias, such as anchor via 232a, anchor via 232b, and anchor via 232c. Although several anchor vias are shown along the edges and in the corners of semiconductor substrate 220, the present inventive concepts may include at least one anchor via placed in at least one corner of the semiconductor substrate. In the alternative, two, four or any other suitable number of anchor vias may be formed in straight or staggered lines, or in specially oriented clusters at each corner and/or along the periphery of semiconductor substrate 210. FIG. 2A further shows dicing street 242, dicing street 244, dicing street 246 and dicing street 248, which delineate portions of the semiconductor substrate which are removed in order to singulate semiconductor substrate 210 into a semiconductor die. As stated above, singulation of semiconductor substrate 210 without the use of anchor vias may result in a backside metal stack peeling from the edges and/or corners of the substrate.

Figure 2B:
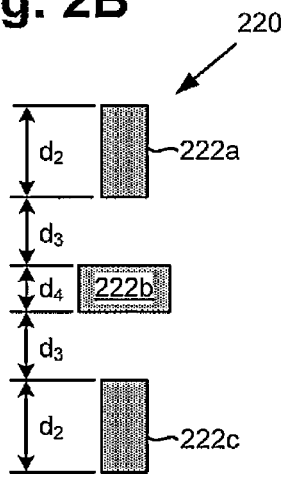
FIG. 2B presents an exemplary diagram disclosing a magnified view of through silicon vias (TSVs).

FIG. 2B presents an exemplary diagram disclosing a magnified view of group 220 of TSVs as shown in FIG. 2A. Although the specific pattern of TSVs shown in FIG. 2A includes a group of 9 TSVs, for simplicity of illustration, only the central three darker shaded TSVs shown in FIG. 2A are shown in FIG. 2B. For example, group 220 of TSVs may include TSV 222a, TSV 222b and TSV 222c. Each of TSVs 222a through 222c may have a length $d_2$ of approximately 8 μm and a width $d_4$ of approximately 3 μm. However, TSVs 222a through 222c are not so limited and may have larger or smaller dimensions according to a specific application. As shown, TSVs 222a through 222c may have alternating orientations such that each TSV has a perpendicular orientation with respect to an adjacent TSV. In addition, each of TSVs 222a through 222c may be separated from one another by a distance $d_3$ of approximately 6 μm.

Because forming each via requires the removal of the semiconductor material at that location, forming too many vias too close together may result in an undesirable perforating effect within the semiconductor substrate, thus forming a cleavage plane. Accordingly, to avoid forming such a cleavage plane, a linear density of metal filler within each anchor via with respect to the substrate, measured across the top surface or bottom surface of semiconductor substrate 210, should desirably be less than 10% of the total linear distance of a straight or staggered line along the periphery of the semiconductor substrate that includes the anchor vias, and most preferably less than 2% of such a total linear distance. In addition, the area of the anchor vias should account for less than approximately 0.5% of the total semiconductor substrate area to avoid adversely affecting subsequent front side processes.

However, with respect to group 220 of TSVs, having the dimensions $d_2$=8 µm, $d_3$=6 µm, and $d_4$=3 µm, the total linear density is:

$$(8\ \mu m+3\ \mu m)/(8\ \mu m+6\ \mu m+3\ \mu m+6\ \mu m)=11\ \mu m/23\ \mu m=\sim 48\%$$

With a linear density of 48% group 220 of TSVs may introduce one or more cleavage planes into semiconductor substrate 210 making the substrate susceptible to breakage.

FIG. 2C presents an exemplary diagram disclosing a magnified view of anchor vias disposed in a straight-line configuration for improved backside metal adhesion, in accordance with an implementation of the present application. For example, view 230a may correspond to 230 of FIG. 2A. FIG. 2C shows anchor via 232a, anchor via 232b and anchor via 232c formed in the periphery of semiconductor substrate 210 along a straight line delineated by plane 235. Each of anchor vias 232a through 232c may have a length $d_5$ of 8 µm and a width $d_7$ of 3 µm. However, anchor vias 232a through 232c are not so limited and may have lengths and widths different from those discussed above and/or different from one anchor via to the next. In order to reduce the linear density of the anchor vias, each anchor via may be spaced from an adjacent anchor via by a large distance relative to its length. For example, FIG. 2C shows each of anchor vias 232a through 232c separated from adjacent anchor vias by a distance $d_6$ of approximately 100 µm. However, this distance $d_6$ may be greater or less than 100 µm depending on the specific application. Thus, by separating each anchor via sufficiently, a linear density of less than 10% may be achieved, avoiding formation of undesirable cleavage planes in semiconductor substrate 210, while still preventing peeling of the backside metal stack. For example, with the above dimensions $d_5$=8 µm and $d_6$=100 µm, the total linear density of anchor vias 232a through 232c is:

$$(8\ \mu m)/(8\ \mu m+100\ \mu m)=8\ \mu m/108\ \mu m=\sim 7\%$$

In the alternative, to further reduce the incidence of cleavage planes in the semiconductor substrate, anchor vias may be staggered from one another with respect to their perpendicular distance to the proximate edges of the semiconductor substrate. For example, FIG. 2D presents an exemplary diagram disclosing a magnified view of anchor vias disposed in a staggered configuration for improved backside metal adhesion, in accordance with an implementation of the present application. For example, view 230b may also correspond to 230 of FIG. 2A. The anchor vias of FIG. 2D may correspond, respectively, to each of the anchor vias of FIG. 2C in all respects with the exception that anchor vias 232a through 232c are alternately formed in a staggered configuration along plane 235 and plane 236, which may be offset from plane 235 by a predetermined distance $d_8$ measured perpendicular to the proximate edge of semiconductor substrate 210. The precise value of $d_8$ may vary depending on the specific application. Thus, the orientation shown in FIG. 2D may prevent backside metal stack peeling while further resisting the formation of cleavage planes within the semiconductor substrate by staggering the placement of the anchor vias with respect to the proximate edge of the semiconductor substrate in addition to ensuring a linear density of less than approximately 10%.

In addition to causing cleavage planes near the dicing streets, having too many anchor vias around the periphery of the semiconductor substrate may adversely affect RF performance. Specifically, forming too many anchor vias around the periphery of the semiconductor substrate may effectively form a faraday cage around the substrate, cancelling the electric field within the cage. Thus, the least number of anchor vias should be fabricated that will satisfactorily prevent peeling of the backside metal stack during fabrication and subsequent operation. Accordingly, forming just one anchor via, or a small cluster of anchor vias near the corners of the semiconductor substrate may be desirable.

Figure 3A:
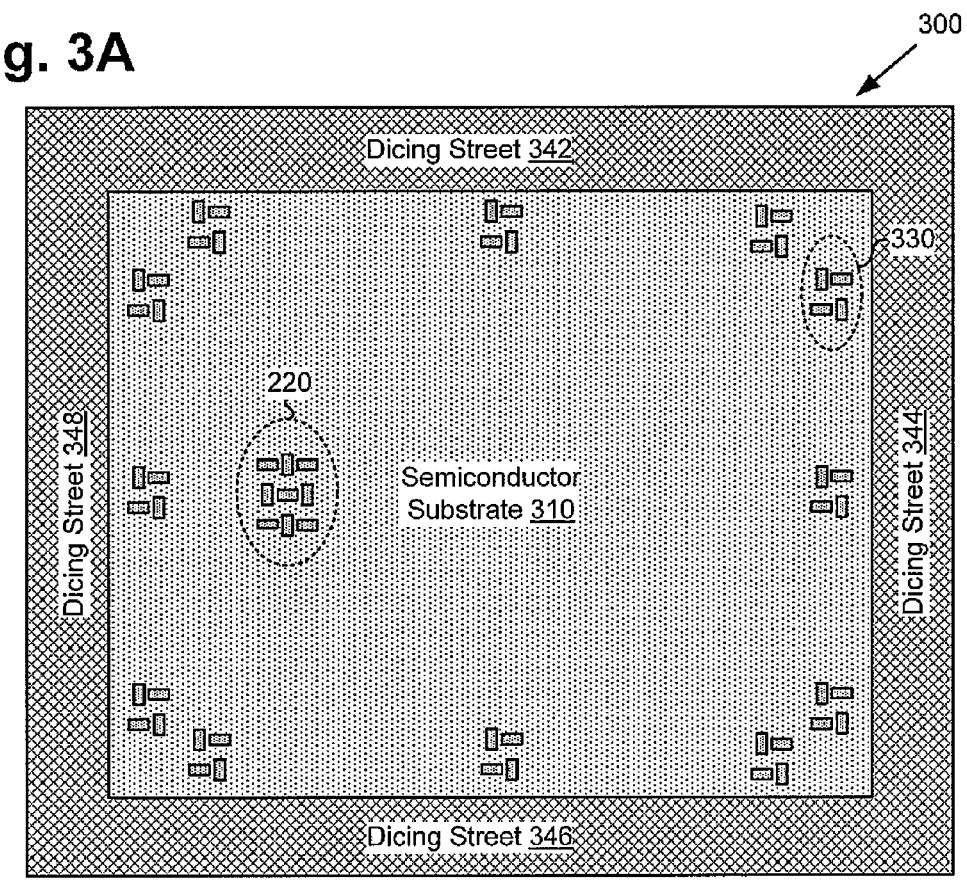
FIG. 3A presents an exemplary diagram disclosing a backside view of a semiconductor structure having clusters of anchor vias for improved backside metal adhesion, in accordance with another implementation of the present application.

FIG. 3A presents an exemplary diagram disclosing a backside view of a semiconductor structure having clusters of anchor vias for improved backside metal adhesion, in accordance with another implementation of the present application. For simplicity of illustration, FIG. 3A provides a backside view 300 of semiconductor substrate 310 after a backside grind or polish and before application of a backside metal stack. FIG. 3A shows semiconductor substrate 310 having group 220 of TSVs and several clusters of anchor vias, such as cluster 330 of anchor vias. FIG. 3A further shows dicing street 342, dicing street 344, dicing street 346 and dicing street 348, which delineate portions of semiconductor substrate 310 which are removed for singulation. As stated above, singulation of semiconductor substrate 310 without the use of anchor vias may result in a backside metal stack peeling from the edges and/or corners of the die. Thus, cluster 330 of anchor vias may be fabricated proximate to a corner of semiconductor substrate 310 in order to prevent the backside metal stack from peeling at the corners of the die.

Figure 3B:
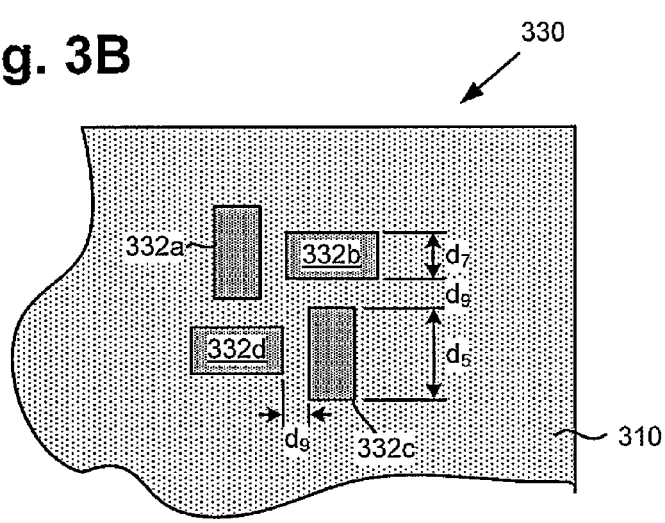
FIG. 3B presents an exemplary diagram disclosing a magnified view of a cluster of anchor vias for improved backside metal adhesion, in accordance with an implementation of the present application.

FIG. 3B presents an exemplary diagram disclosing a magnified view of a cluster of anchor vias for improved backside metal adhesion, in accordance with an implementation of the present application. For example, within FIG. 3B cluster 330 of anchor vias may correspond to cluster 330 of anchor vias shown in FIG. 3A. Cluster 330 of anchor vias may include anchor via 332a, anchor via 332b, anchor via 332c, and anchor via 332d. Each of anchor vias 332a through 332d may have a width $d_7$ of approximately 3 µm, a length $d_5$ of approximately 8 µm, and may be spaced from adjacent anchor vias by a predetermined distance $d_9$. Though distance $d_9$ may vary according to the specific application, values of less than 10 µm may be preferred in order to consolidate the peel-resistance in the corners of the semiconductor substrate. In addition, each of anchor vias 332a through 332d may be oriented in a perpendicular direction to each adjacent anchor via, thus further reducing the probability of forming a cleavage plane. The use of a cluster of anchor vias allows for the use of fewer total anchor vias, while concentrating the "holding power" at the corners, where the stresses prompting backside metal peeling are greatest.

Figure 3C:
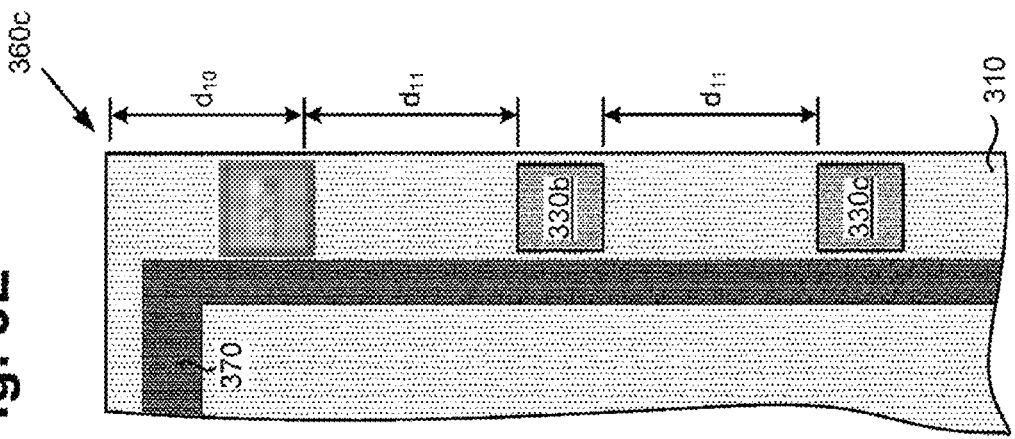
FIG. 3C presents an exemplary diagram disclosing a magnified top side view of a semiconductor structure having anchor vias straddling a seal ring for improved backside metal adhesion, in accordance with an implementation of the present application.
Figure 3D:
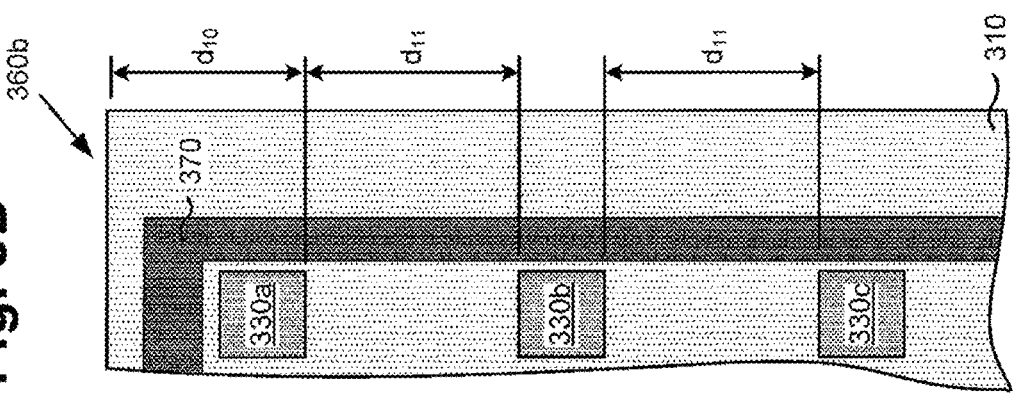
FIG. 3D presents an exemplary diagram disclosing a magnified top side view of a semiconductor structure having anchor vias adjacent to a seal ring for improved backside metal adhesion, in accordance with another implementation of the present application.
Figure 3E:
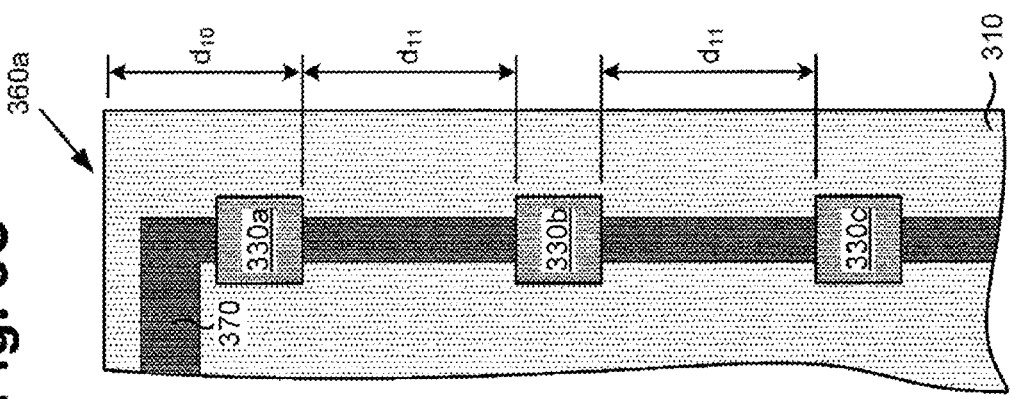
FIG. 3E presents an exemplary diagram disclosing a magnified top side view of a semiconductor structure having anchor vias adjacent to a seal ring for improved backside metal adhesion, in accordance with another implementation of the present application.

In another implementation, where seal rings are utilized on a front side of the semiconductor substrate to prevent cracks from spreading into the substrate during singulation, such anchor vias or clusters of anchor vias may be formed adjacent to or straddling the seal ring, as shown in FIGS. 3C through 3E.

FIG. 3C presents an exemplary diagram disclosing a magnified top side view of a semiconductor structure having anchor vias straddling a seal ring for improved backside metal adhesion, in accordance with an implementation of the present application. For example, magnified view 360a may show seal ring 370 fabricated in a front side process for preventing cracks from spreading into semiconductor substrate 310 during singulation. Clusters 330a, 330b and 330c of anchor vias may be formed adjacent to a proximate edge of semiconductor substrate 310 and straddling seal ring 370. Each of clusters 330a through 330c of anchor vias may correspond to cluster 330 of anchor vias shown in FIG. 3A. Cluster 330a of anchor vias may be formed a predetermined distance $d_{10}$ from the corner of semiconductor substrate 310m which may vary depending on the particular application.

Moreover, each of clusters 330a through 330c of anchor vias may be separated from an adjacent cluster by a distance $d_{11}$, which may be approximately 100 µm. However, distance $d_{11}$ is not so limited and may have a value greater or less than this value depending on the particular application. However, care must be taken to ensure a linear density of substantially less than 10% and preferably less than 2%, while limiting the total surface area of all clusters of anchor vias to less than approximately 0.5% of the total die area, as described above.

FIG. 3D presents an exemplary diagram disclosing a magnified top side view of a semiconductor structure having anchor vias adjacent to a seal ring for improved backside metal adhesion, in accordance with another implementation of the present application. All elements of FIG. 3D may be identical to those as described in FIG. 3C, with the exception that each of clusters 330a, 330b and 330c of anchor vias may be disposed adjacent to and along an inner perimeter of seal ring 370.

FIG. 3E presents an exemplary diagram disclosing a magnified top side view of a semiconductor structure having anchor vias adjacent to a seal ring for improved backside metal adhesion, in accordance with another implementation of the present application. All elements of FIG. 3E may be identical to those as described in FIG. 3C, with the exception that each of clusters 330a, 330b and 330c of anchor vias may be disposed adjacent to and along an outer perimeter of seal ring 370.

Thus, the present inventive concepts utilize one or more anchor vias or clusters of anchor vias disposed along a perimeter and/or at the corners of a semiconductor substrate to prevent undesired peeling of a backside metal stack from the die. Application of such anchor vias for preventing backside metal stack peeling may be extremely beneficial for technologies in which an unpatterned backside metal layer is utilized, such as in the power amplifier and wireless communications markets. Advantages of the present inventive concepts may include substantially reduced incidence of peeling backside metal layers, increased RF performance, increased fabrication yields, and more robust semiconductor substrates and devices.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

The invention claimed is:

1. A structure comprising:
    at least one anchor via disposed in at least one corner of a semiconductor substrate;
    a metal filler within said at least one anchor via, said metal filler having a protruding portion extending from a backside of said semiconductor substrate;
    a backside metal layer on a bottom surface of said semiconductor substrate, said backside metal layer being bonded to said protruding portion of said metal filler of said at least one anchor via;
    wherein said metal filler within said at least one anchor via does not provide ground connection to one or more active devices in said semiconductor substrate.

2. The structure of claim 1, wherein said at least one anchor via comprises a cluster of anchor vias.

3. The structure of claim 2, wherein each anchor via within said cluster of anchor vias is oriented perpendicular to an adjacent anchor via within said cluster of anchor vias.

4. The structure of claim 1, wherein said at least one anchor via comprises a plurality of anchor vias disposed in a straight line along a periphery of said semiconductor substrate.

5. The structure of claim 4, wherein a linear density of said plurality of anchor vias is less than approximately 10% of a total linear distance of said straight line along said periphery of said semiconductor substrate.

6. The structure of claim 1, wherein said at least one anchor via comprises a plurality of anchor vias disposed in a staggered configuration along a periphery of said semiconductor substrate.

7. The structure of claim 1, wherein a total area of said at least one anchor via is less than approximately 0.5% of a total area of said semiconductor substrate.

8. The structure of claim 1, wherein said backside metal layer comprises at least one of an interface layer, a conduction layer, and a packaging layer.

9. The structure of claim 1, wherein said metal filler within said at least one anchor via is bonded to a metal layer overlying said semiconductor substrate.

10. The structure of claim 1, further comprising an insulating layer disposed between said semiconductor substrate and said metal filler in said at least one anchor via.

11. A method comprising:
    forming at least one anchor via in at least one corner of a semiconductor substrate;
    depositing a metal filler within said at least one anchor via, said metal filler having a protruding portion extending from a backside of said semiconductor substrate;
    forming a backside metal layer on a bottom surface of said semiconductor substrate, said backside metal layer being bonded to said protruding portion of said metal filler of said at least one anchor via;
    wherein said metal filler within said at least one anchor via does not provide ground connection to one or more active devices in said semiconductor substrate.

12. The method of claim 11, wherein said forming said at least one anchor via comprises forming a cluster of anchor vias.

13. The method of claim 12, wherein each anchor via within said cluster of anchor vias is oriented perpendicular to an adjacent anchor via within said cluster of anchor vias.

14. The method of claim 11, wherein said forming said at least one anchor via comprises forming a plurality of anchor vias in a straight line along a periphery of said semiconductor substrate.

15. The method of claim 14, wherein a linear density of said plurality of anchor vias is less than approximately 10% of a total linear distance of said straight line along said periphery of said semiconductor substrate.

16. The method of claim 11, wherein said forming said at least one anchor via comprises forming a plurality of anchor vias disposed in a staggered configuration along a periphery of said semiconductor substrate.

17. The method of claim 11, wherein a total area of said at least one anchor via is less than approximately 0.5% of a total area of said semiconductor substrate.

18. The method of claim 11, wherein said forming said backside metal layer on a bottom surface of said semiconductor substrate comprises at least one of:
   forming an interface layer;
   forming a conduction layer;
   forming a packaging layer.

19. The method of claim 11, further comprising bonding said metal filler within said at least one anchor via to a metal layer overlying said semiconductor substrate.

20. The method of claim 11, further comprising forming an insulating layer between said semiconductor substrate and said metal filler in said at least one anchor via.

* * * * *